United States Patent
Iwasaki

(10) Patent No.: US 8,954,817 B2
(45) Date of Patent: Feb. 10, 2015

(54) STORAGE APPARATUS AND CONTROLLER

(71) Applicant: Kiyotaka Iwasaki, Kawasaki (JP)

(72) Inventor: Kiyotaka Iwasaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 13/691,063

(22) Filed: Nov. 30, 2012

(65) Prior Publication Data

US 2014/0040695 A1 Feb. 6, 2014

Related U.S. Application Data

(60) Provisional application No. 61/677,588, filed on Jul. 31, 2012.

(51) Int. Cl.
| | |
|---|---|
| *H03M 13/00* | (2006.01) |
| *H03M 13/29* | (2006.01) |
| *G06F 11/10* | (2006.01) |

(52) U.S. Cl.
CPC ........... *H03M 13/29* (2013.01); *G06F 11/1008* (2013.01)
USPC ........................................ 714/755; 714/800

(58) Field of Classification Search
CPC .......................... H03M 13/2957; H03M 13/29
USPC ................................................ 714/755, 800
See application file for complete search history.

(56) References Cited

U.S. PATENT DOCUMENTS

| | | | |
|---|---|---|---|
| 6,986,560 B2 * | 1/2006 | Silverbrook et al. | 347/15 |
| 7,783,950 B2 * | 8/2010 | Esumi et al. | 714/752 |
| 7,840,878 B1 * | 11/2010 | Tang et al. | 714/770 |
| 8,086,933 B2 | 12/2011 | Yamaga | |
| 8,255,764 B1 * | 8/2012 | Yeo et al. | 714/758 |
| 8,255,765 B1 * | 8/2012 | Yeo et al. | 714/758 |
| 2006/0152981 A1 | 7/2006 | Ryu | |
| 2009/0063934 A1 | 3/2009 | Jo | |
| 2009/0241009 A1 | 9/2009 | Kong et al. | |

FOREIGN PATENT DOCUMENTS

| | | |
|---|---|---|
| JP | 2006-195990 | 7/2006 |
| JP | 2009-54159 | 3/2009 |
| JP | 2009-211209 | 9/2009 |
| JP | 2011-515784 | 5/2011 |

* cited by examiner

*Primary Examiner* — Fritz Alphonse
(74) *Attorney, Agent, or Firm* — Oblon, Spivak, McClelland, Maier & Neustadt, L.L.P.

(57) ABSTRACT

According to at least one embodiment, a storage apparatus reads first sector data and a first error correcting code. The storage apparatus performs first decoding for the read first sector data using the read first error correcting code. The storage apparatus stores an error correction result by the first decoding. The storage apparatus performs second decoding for decoding-data associated with a second error correcting code using the second error correcting code. The storage apparatus transfers the second error correcting code and the decoding-data via the first buffer storing the error correction result.

15 Claims, 12 Drawing Sheets

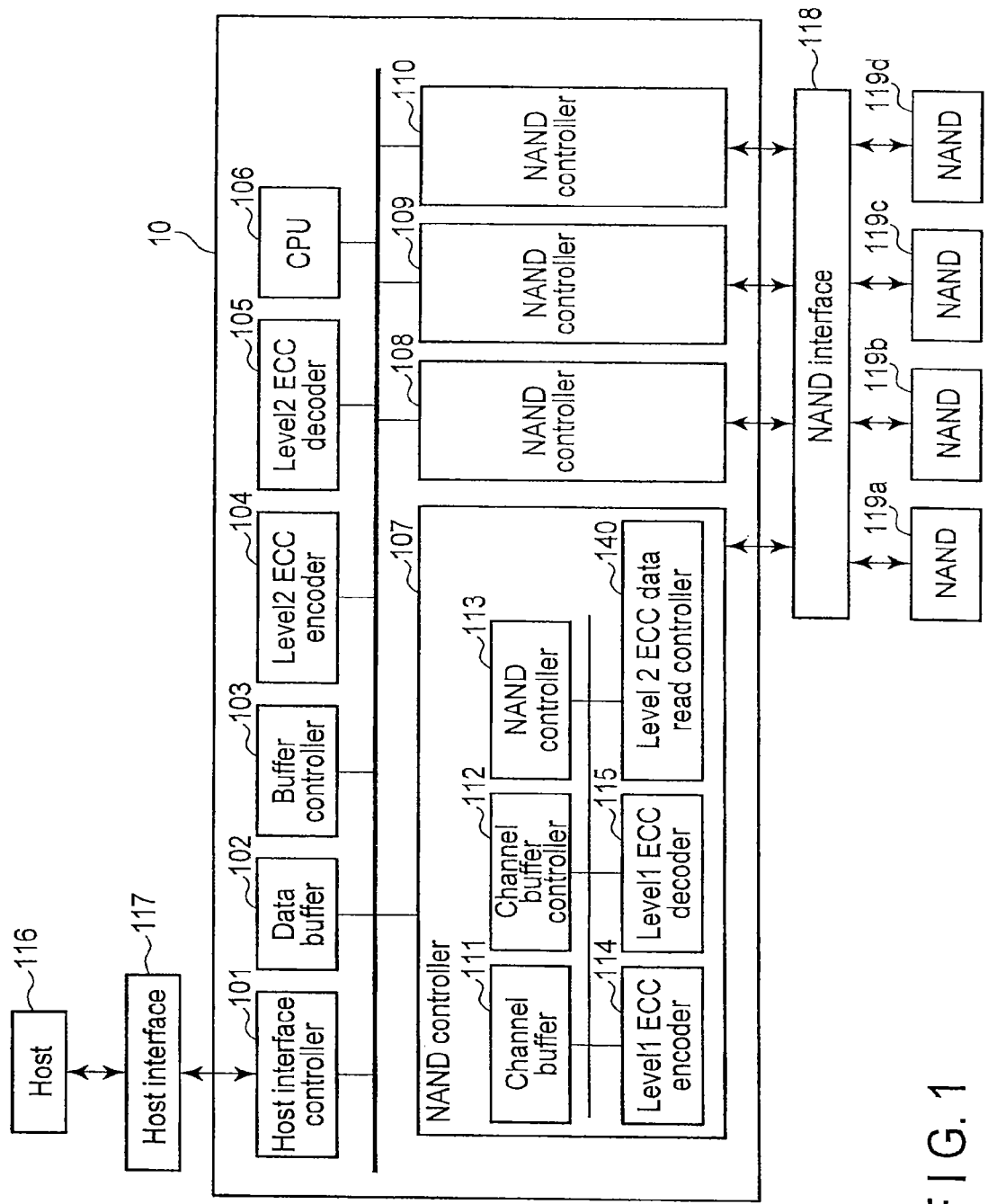
F I G. 1

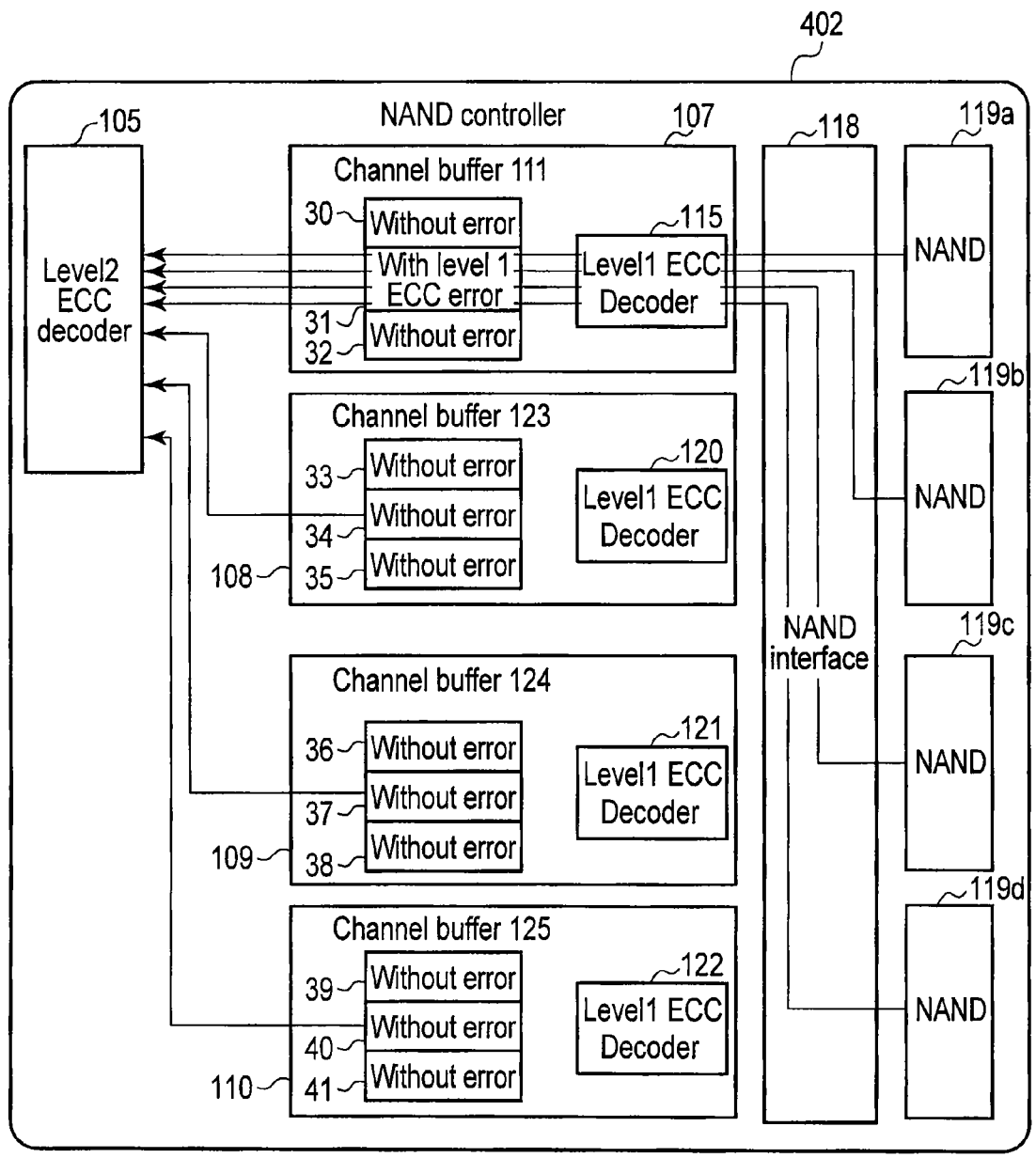
F I G. 4

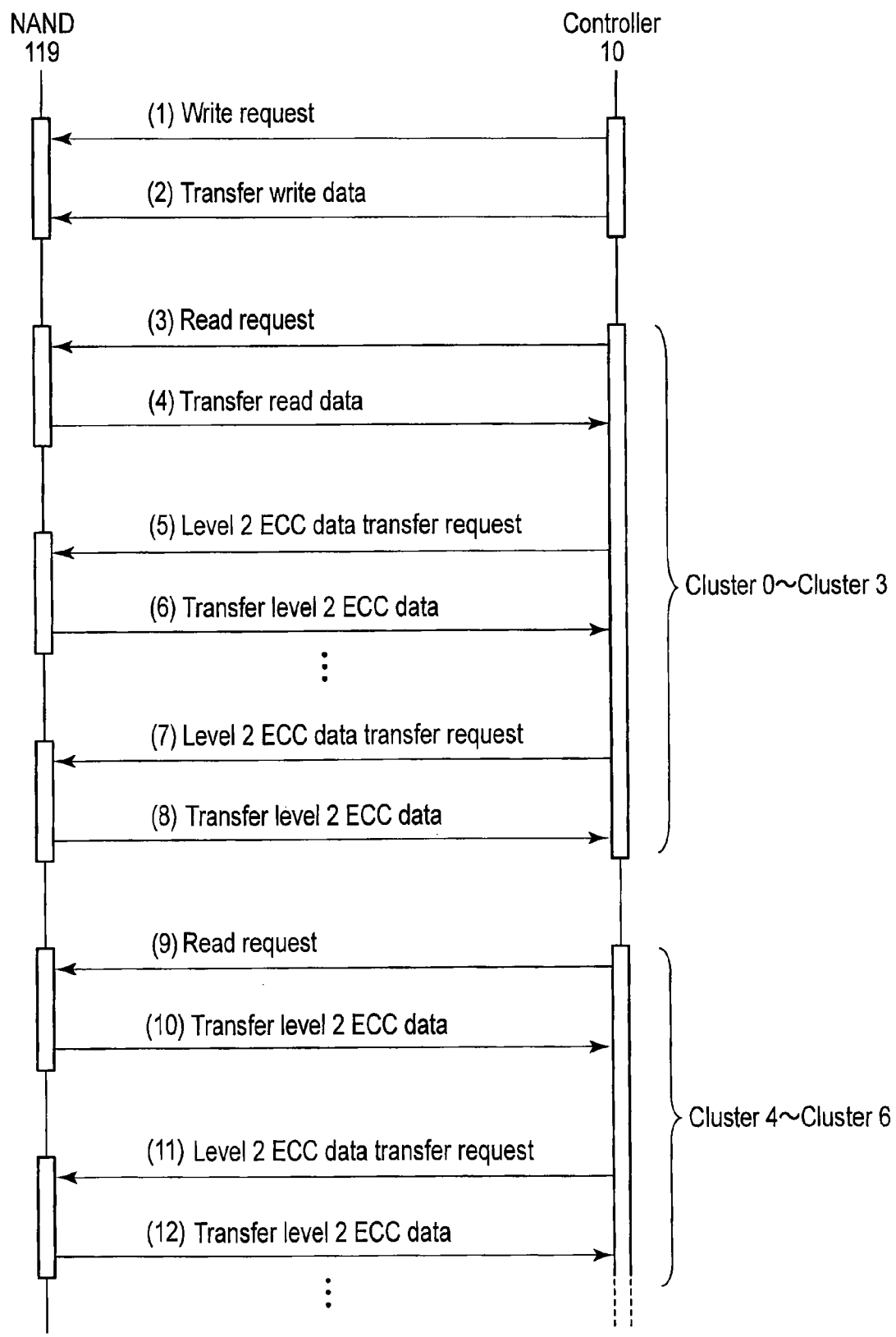
F I G. 8

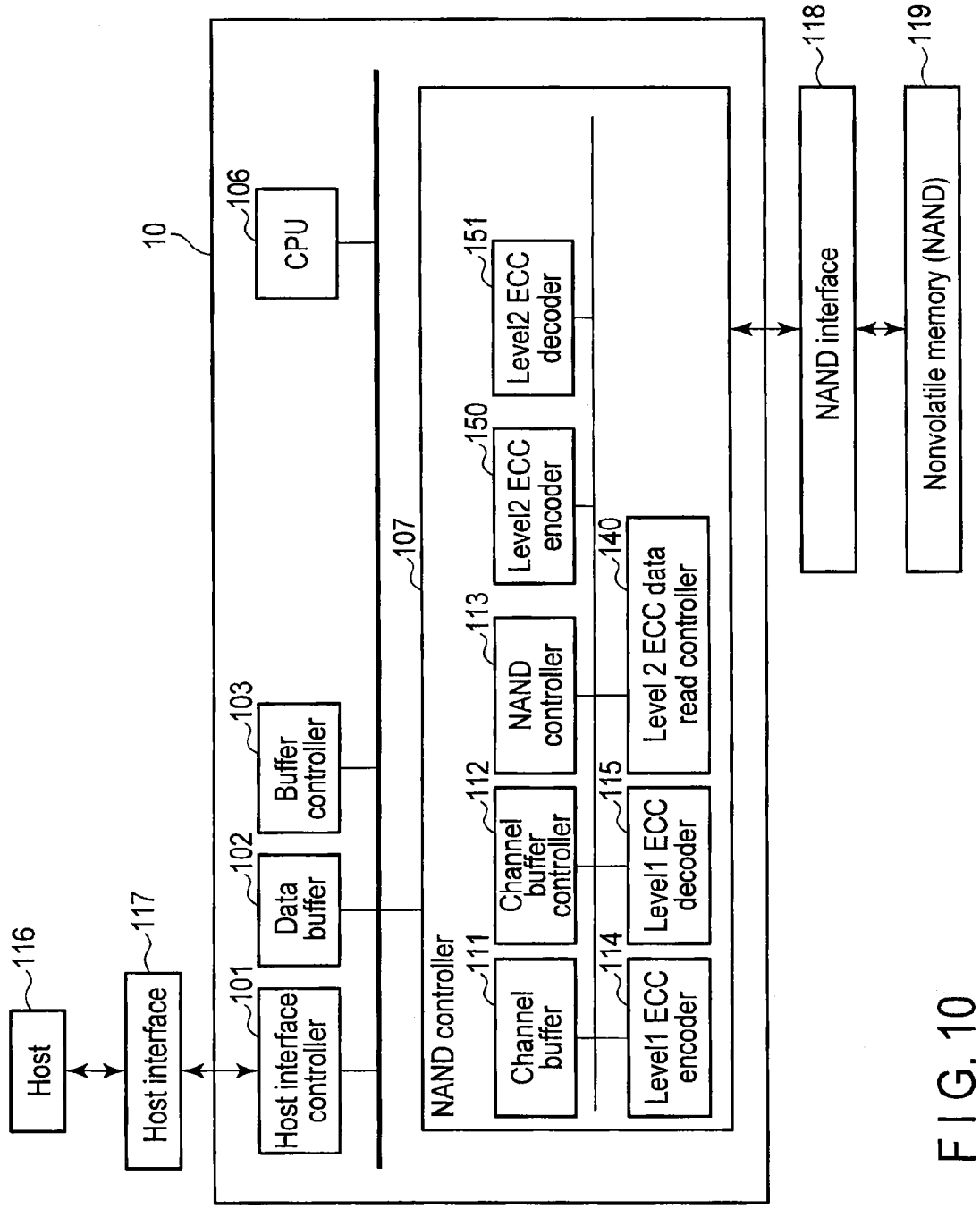
F I G. 10

STORAGE APPARATUS AND CONTROLLER

CROSS-REFERENCE TO RELATED APPLICATIONS

This application claims the benefit of U.S. Provisional Application No. 61/677,588, filed Jul. 31, 2012, the entire contents of which are incorporated herein by reference.

FIELD

Embodiments described herein relate generally to a storage apparatus which can control a nonvolatile memory.

BACKGROUND

In recent years, the storage apparatus including a controller configured to control a nonvolatile memory has been developed. This controller controls to write data to the nonvolatile memory or read data from the nonvolatile memory. Data is encoded and written to the nonvolatile memory. The data stored in the nonvolatile memory is read and decoded.

Technologies of correcting error in the data read from the nonvolatile memory have also been developed. In the technologies, when writing the data to the nonvolatile memory, an ECC (Error Checking and Correcting Code) is generated from the data to be written. The error that occurs in the data when reading the data from the nonvolatile memory can be corrected using the ECC. Using a plurality of ECCs of different error correcting capabilities enables to decrease the number of errors in the read data.

However, to use a plurality of ECCs, for example, in addition to a buffer or the like to temporarily store data read using an ECC having low error correcting capability, a buffer or the like to temporarily store data read using an ECC having high error correcting capability is needed. That is, the circuit scale of a buffer or the like in the controller becomes large. Additionally, control using a plurality of ECCs is generally complex. For this reason, it is necessary to facilitate control for the plurality of ECCs.

BRIEF DESCRIPTION OF THE DRAWINGS

FIG. 1 is an exemplary block diagram showing a system configuration according to the first embodiment.

FIG. 4 is an exemplary view showing the second operation state of the error correction decoding of the controller according to the first embodiment.

FIG. 8 is an exemplary sequence chart showing the data processing procedure between the controller and the nonvolatile memory according to the first embodiment.

FIG. 10 is an exemplary block diagram showing a system configuration according to the second embodiment.

DETAILED DESCRIPTION

Figure 2:
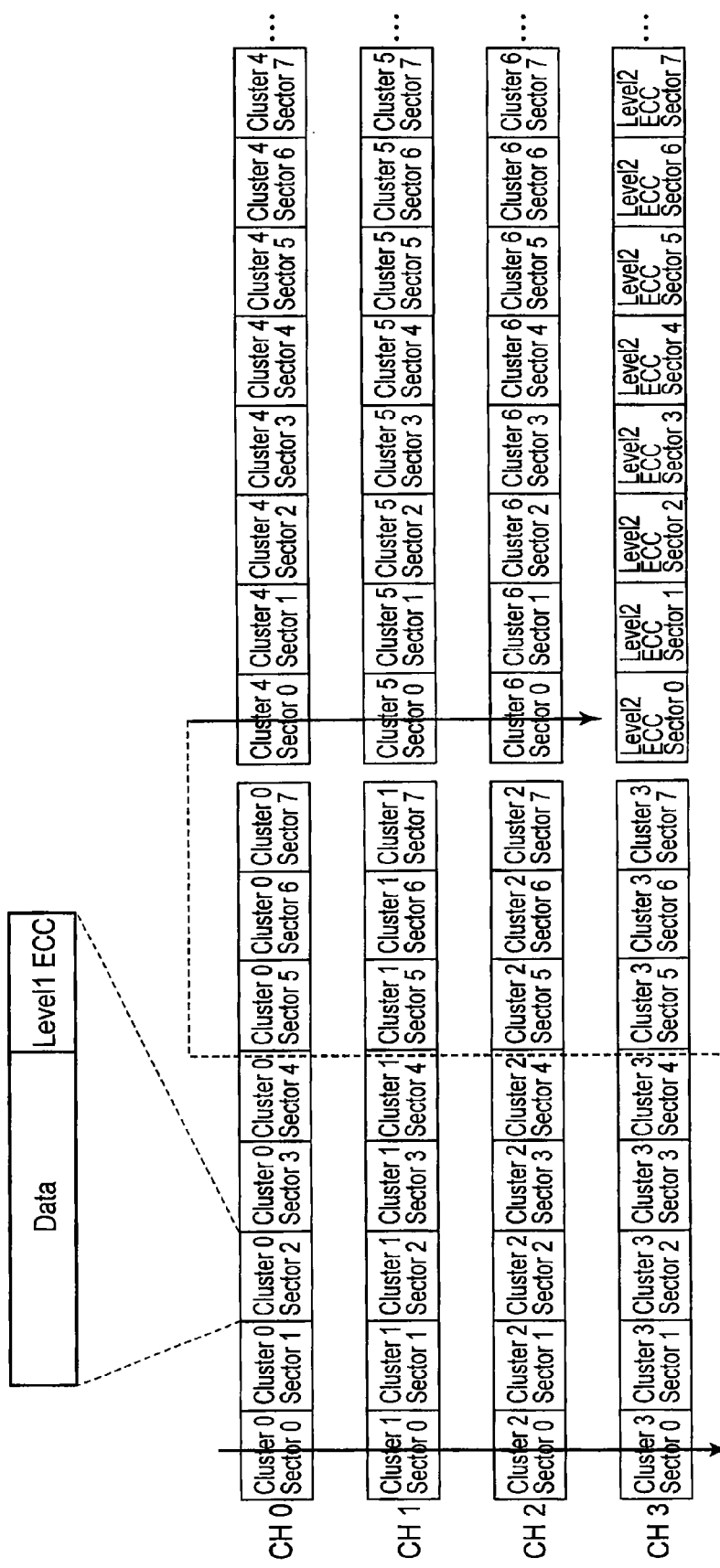
FIG. 2 is an exemplary view showing an example of the format of data stored in a nonvolatile memory according to the first embodiment.

In general, according to one embodiment, a storage apparatus includes a read module, a first decoder, a first buffer, a second decoder, and a transfer controller. The read module is configured to read first sector data and a first error correcting code associated with the first sector data from a nonvolatile memory. The first decoder is configured to perform first decoding for the read first sector data using the read first error correcting code to correct an error in the read first sector data. The first buffer is configured to store an error correction result by the first decoding. The second decoder is configured to perform second decoding for decoding-data associated with a second error correcting code, using the second error correcting code to correct at an accuracy higher than an accuracy of the first error correcting code, if the error correction result stored in the first buffer includes information that the error cannot be corrected using the first error correcting code. The transfer controller is configured to transfer the second error correcting code and the decoding-data to the second decoder via the first buffer storing the error correction result with the information, to perform the second decoding.

First Embodiment

The first embodiment will now be described with reference to the accompanying drawings.

FIG. 1 is a block diagram showing a system configuration according to this embodiment.

A controller 10 includes a host interface controller 101, a data buffer 102, a buffer controller 103, a level 2 ECC encoder 104, a level 2 ECC decoder 105, a CPU 106, and NAND controllers 107, 108, 109, and 110.

The host interface controller 101 communicates with a host 116 via a host interface 117. During a period until data received from the host 116 is transferred to the NAND controller 107, the data buffer 102 temporarily holds the data received from the host 116. During a period until data received from each of the NAND controllers 107, 108, 109, and 110 is transferred to the host 116, the data buffer 102 also temporarily holds the data received from each NAND controller.

The buffer controller 103 controls data reading from the data buffer 102. The buffer controller 103 controls data writing to the data buffer 102. The level 2 ECC encoder 104 is an encoder for level 2 ECC encoding.

The level 2 ECC will be described. In this embodiment, when reading data from the nonvolatile memory, two types of ECCs of different error correcting capabilities are used to correct errors in the read data. The two types of ECCs will be referred to as a level 1 ECC and the level 2 ECC hereinafter. The level 2 ECC is an ECC having an error correcting capability higher than an error correcting capability of the level 1 ECC. Note that details of the level 1 ECC and the level 2 ECC will be described later with reference to FIG. 2. In this embodiment, an "error" means an error in data read from the nonvolatile memory. The error in data means, for example, reading bit "0" of data (data to be read) stored in the nonvolatile memory as "1". Note that as for this "error", error detection to check whether the read data includes the error is performed before correcting the error. "Correction" when correcting the error using the ECC means performing decoding to correct the error using the ECC obtained by encoding the read data, thereby correcting the error in the read data including the error and reading the data that should be read.

The level 2 ECC decoder 105 is a decoder for the level 2 ECC decoding. The CPU 106 controls the entire system of the first embodiment. Each of the NAND controllers 107, 108, 109, and 110 performs reading data from nonvolatile memories (NANDs) 119a, 119b, 119c, and 119d and writing data to the nonvolatile memories (NANDs) 119a, 119b, 119c, and 119d. Note that data stored in each of the NANDs 119a to 119d is connected to each of the NAND controllers 107, 108, 109, and 110 via a NAND interface 118. For this reason, for example, the NAND controller 107 can access the NAND 119d. A case will be explained below, in which each of the NANDs 119a to 119d is a NAND flash memory. However, each of the NANDs 119a to 119d may be a nonvolatile (non-transitory) memory other than the NAND flash memory.

Note that each of the NAND controllers 107, 108, 109, and 110 will also be referred to as a channel (CH) hereinafter. The channel is the minimum constituent unit of the controller 10 which allowed to access to the NANDs 119a, 119b, 119c, and 119d.

The NAND controller 107 includes a channel buffer 111, a channel buffer controller 112, a NAND controller 113, a level 1 ECC encoder 114, a level 1 ECC decoder 115, and a level 2 ECC data read controller 140.

During a period in which data stored in each of the NANDs 119a to 119d is read, and data is written to each of the NANDs 119a to 119d, the channel buffer 111 temporarily holds the data to be read and/or to be written. The channel buffer controller 112 controls data reading from the channel buffer 111 and data writing to the channel buffer 111. The NAND controller 113 controls data read from each of the NANDs 119a to 119d and data write to each of the NANDs 119a to 119d. The level 1 ECC encoder 114 is an encoder for level 1 ECC encoding. The level 1 ECC decoder 115 is a decoder for level 1 ECC decoding.

The level 2 ECC data read controller 140 has a function of reading the data for the level 2 ECC decoding from each of the NANDs 119a to 119d using an area to hold data including a level 1 ECC correction disable error (to also be referred to as an error hereinafter) in the channel buffer 111. The "error" will be explained. In this embodiment, the "error" means that an error included in data read from the nonvolatile memory could not be corrected by the level 1 ECC decoding. For example, if a result of the level 1 ECC decoding indicates the error, error correction using the level 1 ECC decoding cannot be performed for the data read from the nonvolatile memory. Hence, it is necessary to perform the level 2 ECC decoding as will be described later.

A "result" of decoding will be described. In this embodiment, a "result" of decoding means a result of decoding performed to correct the above-described "error". Note that a "result" of the level 1 ECC decoding includes error-corrected data. If the error could not be corrected by the level 1 ECC decoding, the "result" of the level 1 ECC decoding includes data containing information representing that the error could not be corrected. However, if the error could not be corrected, data including the error before the error correction may be the "result" of the level 1 ECC decoding.

The above-described "using an area to hold data including an error" means transferring, to the level 2 ECC decoder 105, data for the level 2 ECC decoding via the channel buffer 111 or a partial area of the channel buffer 111 that stores data including the error as a result of the level 1 ECC decoding. "Via the channel buffer 111 or a partial area of the channel buffer 111" means using the channel buffer 111 or a partial area of the channel buffer 111 as, for example, a buffer for temporarily holding data to transfer data for the level 2 ECC decoding to the level 2 ECC decoder 105.

Note that each of the NAND controllers 108, 109, and 110 also has a channel buffer, a channel buffer controller, a NAND controller, a level 1 ECC encoder, a level 1 ECC decoder, and a level 2 ECC data read controller, which have the same functions as those of the channel buffer 111, the channel buffer controller 112, the NAND controller 113, the level 1 ECC encoder 114, the level 1 ECC decoder 115, and the level 2 ECC data read controller 140 included in the above-described NAND controller 107.

FIG. 1 illustrates a case in which the controller 10 includes four NAND controllers (that is, the number of channels is 4). In this embodiment, the controller 10 need only include at least two NAND controllers (that is, the number of channels is at least 2).

An example of the format of data stored in the channel buffer of each channel will be described next with reference to FIG. 2. Note that the data format shown in FIG. 2 is an example of the data format in each of the NANDs 119a to 119d which store level 1 ECCs and level 2 ECCs.

FIG. 2 illustrates a case in which data of a plurality of clusters are assigned to each of four channels represented by CH0 to CH3. Note that one cluster corresponds to eight data sectors. For example, eight data sectors (Cluster 0 Sector 0 to Cluster 0 Sector 7) form one cluster (Cluster 0). Eight data sectors (Cluster 4 Sector 0 to Cluster 4 Sector 7) form one cluster (Cluster 4). Cluster 0 and Cluster 4 are assigned to CH0. Similarly, Cluster 1 and Cluster 5 are assigned to CH1. Cluster 2 and Cluster 6 are assigned to CH2. However, CH3 is assigned with Cluster 3 and data sectors (Level 2 ECC Sector 0 to Level 2 ECC Sector 7) that store the data of eight different level 2 ECCs.

The level 1 ECC will be described. Each of the data sectors except the Level 2 ECC Sector 0 to the Level 2 ECC Sector 7 (to be referred to as each data sector hereinafter) includes data (DATA) and the level 1 ECC. DATA of each data sector is encoded on the data sector basis. An encoding result concerning the level 1 ECC is stored as the level 1 ECC immediately after DATA stored in each data sector.

In this embodiment, the level 2 ECC is generated by encoding data across channels. More specifically, the level 2 ECC is encoded using data corresponding to two clusters of each of CH0 to CH2 and one cluster (Cluster 3) of CH3. An encoding result concerning the level 2 ECC is stored as the level 2 ECC in the second cluster (Level 2 ECC Sector 0 to Level 2 ECC Sector 7 shown in FIG. 2) of CH3.

The difference between the level 1 ECC decoding and the level 2 ECC decoding will be explained. In this embodiment, the level 1 ECC decoding means decoding data read from the nonvolatile memory using the level 1 ECC associated with each data sector to correct the error included in the read data. On the other hand, the level 2 ECC decoding means decoding a level 1 ECC decoding result or sector data corresponding to the level 1 ECC decoding result, using the level 2 ECC associated with a plurality of sector data read by a plurality of channels, to correct the error that cannot be corrected by the level 1 ECC decoding. Note that sector data corresponding to the level 1 ECC decoding result means sector data corresponding to the level 1 ECC decoding result which is read from the nonvolatile memory again after the level 1 ECC decoding. As described above, in this embodiment, the level 2 ECC decoding is performed to correct the error as needed after the level 1 ECC decoding has been performed.

The level 1 ECC is associated with each data sector. In other words, the level 1 ECC is encoded and generated for the each data sector. On the other hand, the level 2 ECC is encoded and generated for a plurality of sector data. For this reason, for example, since the code length of the level 2 ECC is longer than the code length of the level 1 ECC, the level 2 ECC decoding has the error correcting capability higher than the error correcting capability of the level 1 ECC decoding, as described above. In other words, the level 2 ECC decoding can correct the error at an accuracy higher than the error of level 1 ECC decoding.

In this embodiment, the level 1 ECC decoding is performed by the level 1 ECC decoder 115 and the like incorporated for each of the plurality of channels. However, the level 2 ECC decoding is performed not for each channel but by the level 2 ECC decoder 105 shared by the plurality of channels. It is necessary to only perform decoding using two different error correcting codes according to this embodiment described above. Hence, as the error correcting codes of different error correcting capabilities, for example, a Hamming code can be used as the level 1 ECC, and a Reed-Solomon code can be used as the level 2 ECC.

In this embodiment, the level 2 ECC is generated such that data sector numbers correspond to the level 2 ECC sector number. More specifically, as indicated by the arrow in FIG. 2, when generating the Level 2 ECC Sector 0, data corresponding to Sector 0 (Cluster 0 Sector 0, Cluster 1 Sector 0, Cluster 2 Sector 0, Cluster 3 Sector 0, Cluster 4 Sector 0, Cluster 5 Sector 0, and Cluster 6 Sector 0) of each of the seven clusters across the channels is used. An encoding result corresponding to sector number 0 is stored in the Level 2 ECC Sector 0 as the level 2 ECC. Similarly, results of encoding using data corresponding to Sector 1 to Sector 7 are stored in Level 2 ECC Sector 1 to Level 2 ECC Sector 7, respectively.

The flow of data when the error correction is done using the level 2 ECC after the level 1 ECC error has occurred in the NAND controller 107 will be described next with reference to FIGS. 3, 4, 5, and 6.

Figure 3:
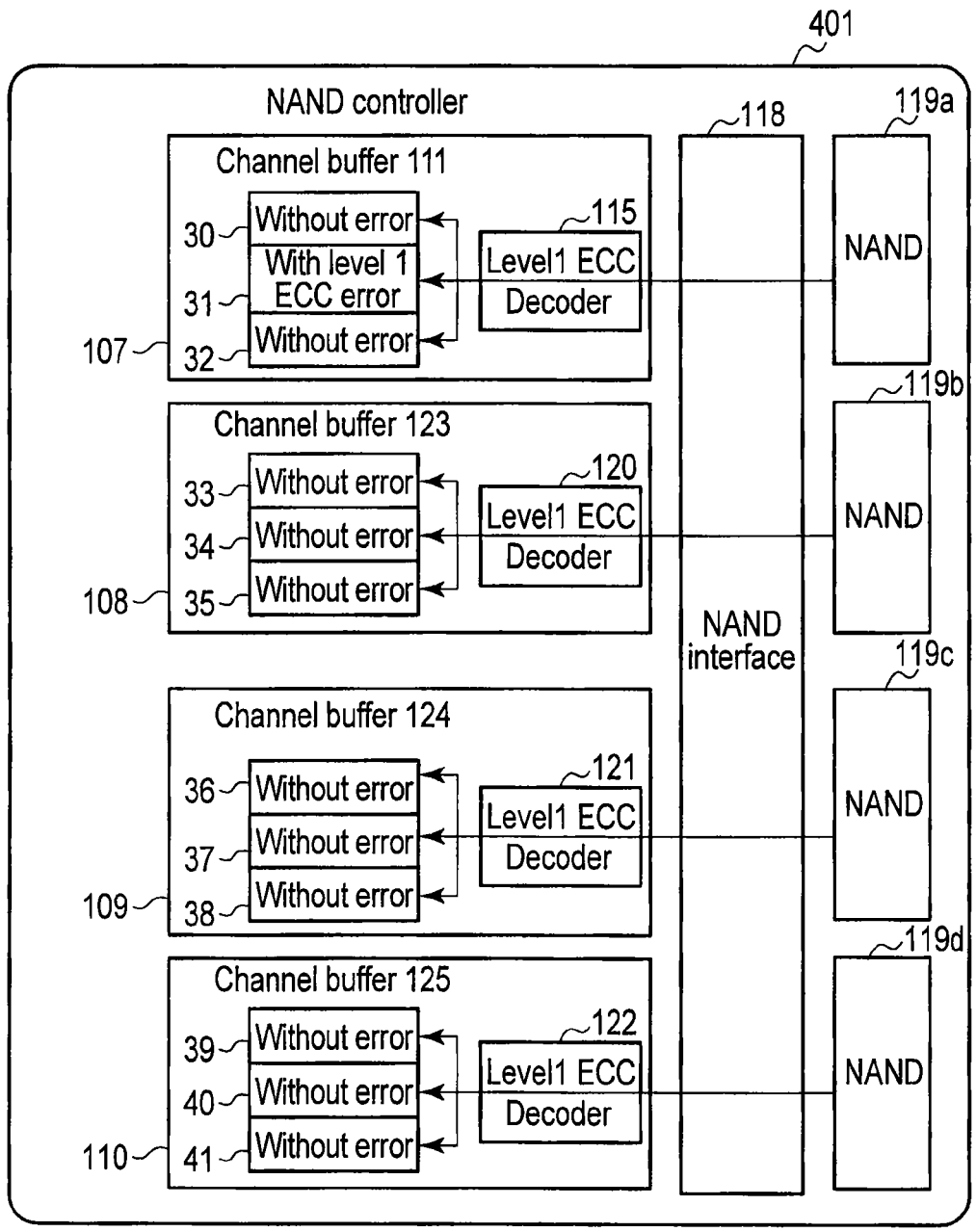
FIG. 3 is an exemplary view showing the first operation state of error correction decoding of a controller according to the first embodiment.

A state 401 shown in FIG. 3 represents a state of an operation when the level 1 ECC uncorrectable error has occurred in a result obtained by decoding data read from the NAND 119a to the channel buffer 111 using the level 1 ECCs.

Concerning the NAND controller 107, the level 1 ECC decoder 115 decodes, using the level 1 ECCs, data (Cluster 0 Sector 0 to Cluster 0 Sector 7) read from the NAND 119a. The channel buffer 111 stores the result of decoding by the level 1 ECC decoder 115. The channel buffer 111 has three areas (areas 30, 31, and 32). The result of decoding for part of the data read from the NAND 119a is stored in each area. For example, the result of the level 1 ECC decoding for data included in data sectors indicated by Cluster 0 Sector 0 to Cluster 0 Sector 2 in FIG. 2 is stored in the area 30. The result of the level 1 ECC decoding for data included in a data sector indicated by Cluster 0 Sector 3 in FIG. 2 is stored in the area 31. The result of the level 1 ECC decoding for data included in data sectors indicated by Cluster 0 Sector 4 to Cluster 0 Sector 7 in FIG. 2 is stored in the area 32. Referring to FIG. 3, the result of decoding by the level 1 ECC decoder 115 without an error as the result of the level 1 ECC decoding is stored in each of the area 30 and 32. A decoding result including the level 1 ECC error is stored in the area 31. In FIG. 3, an example is illustrated that the channel buffer 111 is divided into three areas, and the result of the level 1 ECC decoding for a data sector is stored in each area, as described above, for the descriptive convenience. However, the channel buffer 111 may be divided into areas in number other than 3, and the result of the level 1 ECC decoding for any of the data sectors Cluster 0 Sector 0 to Cluster 0 Sector 7 may be stored in each area.

Concerning the NAND controller 108, a level 1 ECC decoder 120 decodes data (Cluster 1 Sector 0 to Cluster 1 Sector 7) read from the NAND 119b using the level 1 ECCs. A channel buffer 123 stores the result of decoding by the level 1 ECC decoder 120. The channel buffer 123 has three areas (areas 33, 34, and 35). The result of decoding for part of the data read from the NAND 119b is stored in each area. For example, the result of the level 1 ECC decoding for data included in data sectors indicated by Cluster 1 Sector 0 to Cluster 1 Sector 2 in FIG. 2 is stored in the area 33. The result of the level 1 ECC decoding for data included in a data sector indicated by Cluster 1 Sector 3 in FIG. 2 is stored in the area 34. The result of the level 1 ECC decoding for data included in data sectors indicated by Cluster 1 Sector 4 to Cluster 1 Sector 7 in FIG. 2 is stored in the area 35. Referring to FIG. 3, the result of decoding by the level 1 ECC decoder 120 without an error as the result of the level 1 ECC decoding is stored in the areas 33, 34, and 35.

Concerning the NAND controller 109, a level 1 ECC decoder 121 decodes data (Cluster 2 Sector 0 to Cluster 2 Sector 7) read from the NAND 119c using the level 1 ECCs. A channel buffer 124 stores the result of decoding by the level 1 ECC decoder 121. The channel buffer 124 has three areas (areas 36, 37, and 38). The result of decoding for part of the data read from the NAND 119c is stored in each area. For example, the result of the level 1 ECC decoding for data included in data sectors indicated by Cluster 2 Sector 0 to Cluster 2 Sector 2 in FIG. 2 is stored in the area 36. The result of the level 1 ECC decoding for data included in a data sector indicated by Cluster 2 Sector 3 in FIG. 2 is stored in the area 37. The result of the level 1 ECC decoding for data included in data sectors indicated by Cluster 2 Sector 4 to Cluster 2 Sector 7 in FIG. 2 is stored in the area 38. Referring to FIG. 3, the result of decoding by the level 1 ECC decoder 121 without an error as the result of level 1 ECC decoding is stored in each of the areas 36, 37, and 38.

Concerning the NAND controller 110, a level 1 ECC decoder 122 decodes data (Cluster 3 Sector 0 to Cluster 3 Sector 7) read from the NAND 119d using the level 1 ECCs. A channel buffer 125 stores the result of decoding by the level 1 ECC decoder 122. The channel buffer 125 has three areas (areas 39, 40, and 41). The result of decoding for part of the data read from the NAND 119d. For example, the result of the level 1 ECC decoding for data included in data sectors indicated by Cluster 3 Sector 0 to Cluster 3 Sector 2 in FIG. 2 is stored in the area 39. The result of the level 1 ECC decoding for data included in a data sector indicated by Cluster 3 Sector 3 in FIG. 2 is stored in the area 40. The result of the level 1 ECC decoding for data included in data sectors indicated by Cluster 3 Sector 4 to Cluster 3 Sector 7 in FIG. 2 is stored in the area 41. Referring to FIG. 3, the result of decoding by the level 1 ECC decoder 122 without an error as the result of the level 1 ECC decoding in each of the areas 39, 40, and 41.

A state 402 shown in FIG. 4 represents a state of an operation for starting the level 2 ECC decoding when the level 1 ECC decoding result includes an error. In this embodiment, if the level 1 ECC decoding result includes the error, data (level 2 ECC data) necessary for the level 2 ECC decoding are transferred from the NANDs to the level 2 ECC decoder 105 using the area where the result is stored. The level 2 ECC data are, for example, data used to generate the level 2 ECC. In FIG. 2, for example, concerning the data of the level 2 ECC stored in the Level 2 ECC Sector 0, the data is used to generate the level 2 ECC are DATA of Cluster 0 Sector 0, Cluster 1 Sector 0, Cluster 2 Sector 0, Cluster 3 Sector 0, Cluster 4 Sector 0, Cluster 5 Sector 0, and Cluster 6 Sector 0.

The operation of the state 402 will be described in detail. The level 1 ECC decoding result including the error is stored in the area 31. For this reason, data corresponding to the decoding result with the error stored in the area 31 needs to undergo the error correction decoding (restoration) using the level 2 ECC. The level 2 ECC data which have not been read yet are transferred from the NANDs to the level 2 ECC decoder 105 via the area 31. As indicated by the arrows in FIG. 4, data of Cluster 4 Sector 0 is transferred from the NAND 119a as the level 2 ECC data using the area 31. Similarly, data of Cluster 5 Sector 0 is transferred from the NAND 119b, data of Cluster 6 Sector 0 is transferred from the NAND 119c, and data of the Level 2 ECC Sector 0 is transferred from the NAND 119d. Note that since the level 2 ECC data transferred from each NAND is transferred via the area 31, the amount of the level 2 ECC data which can transfer simultaneously may depend on the buffer capacity of the area 31.

In addition, data of Cluster 1 Sector 0, Cluster 2 Sector 0, and Cluster 3 Sector 0 which have been decoded using the level 1 ECCs without the error and already stored in the areas 34, 37, and 40 are transferred from the areas 34, 37, and 40 to the level 2 ECC decoder 105.

Note that the data of Cluster 0 Sector 0 may be read from the NAND 119a, or may be the data stored in the area 31 as the level 1 ECC decoding result. As shown in FIG. 4, when reading the level 2 ECC data from the NANDs, the level 2 ECC data are transferred from the NANDs to the level 2 ECC decoder 105 via the level 1 ECC decoder 115. However, the level 2 ECC data may be transferred to the level 2 ECC decoder 105 without intervening the level 1 ECC decoder 115.

Figure 5:
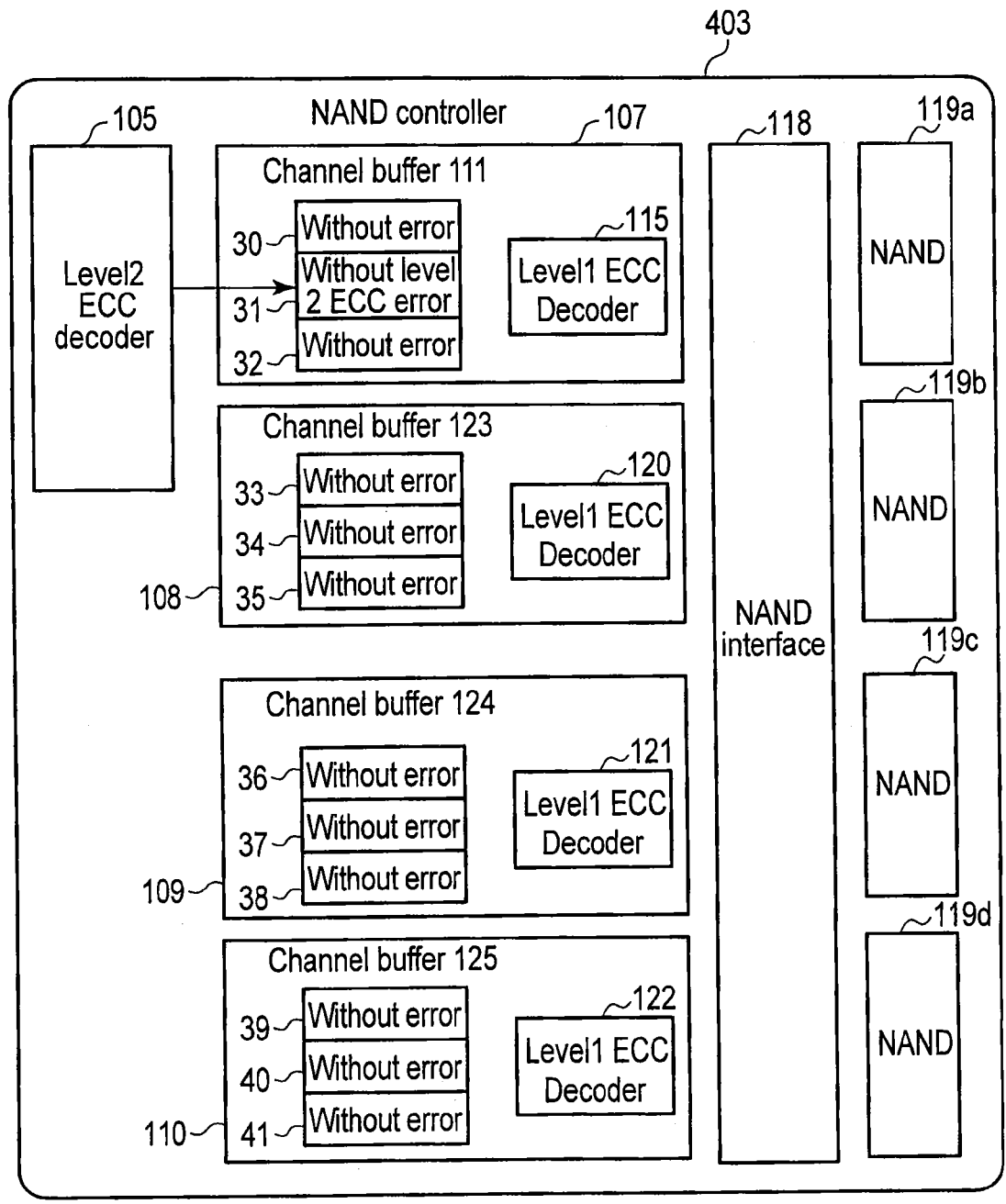
FIG. 5 is an exemplary view showing the third operation state of the error correction decoding of the controller according to the first embodiment.

The operation next to the operation shown in FIG. 4 will be described below with reference to FIG. 5. A state 403 represents a state of an operation of writing a level 2 ECC decoding result.

The level 2 ECC decoder 105 performs decoding using the transferred level 2 ECC data. When correction of the level 1 ECC decoding error has succeeded, the decoding result (restored data) is written, as the level 2 ECC decoding result without the error, to the position (area 31) where the level 1 ECC decoding error has occurred.

Figure 6:
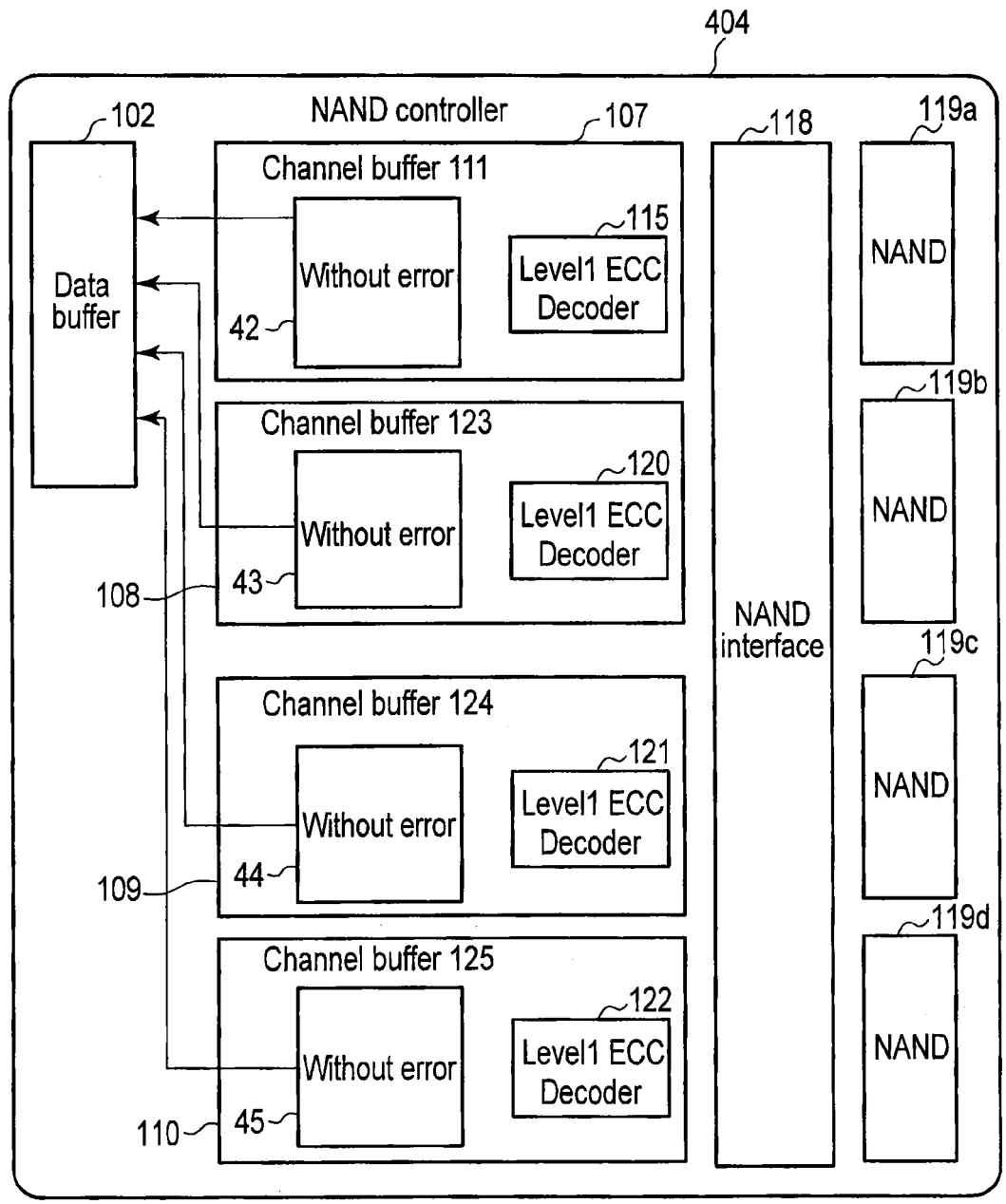
FIG. 6 is an exemplary view showing the fourth operation state of the error correction decoding of the controller according to the first embodiment.

A state 404 shown in FIG. 6 represents a state of an operation to transfer data stored in all channel buffers to the data buffer 102, in case that errors have been eliminated from the data stored in all channel buffers as the result of the level 2 ECC decoding, and the data can be transferred to the host 116.

More specifically, it is assumed that the error does not exist in areas 42, 43, 44, and 45 that are all areas of each of the channel buffers 111, 123, 124, and 125, as shown in FIG. 6. In this case, the level 2 ECC decoding results (data), which do not include the error and are stored in each of the areas 42 to 45, are transferred from the channel buffers 111, 123, 124, and 125 to the data buffer 102.

It is assumed that data including the error is transferred to the data buffer 102, unlike this embodiment. In this case, another error correction decoding needs to be performed for the data transferred to the data buffer 102, and control to perform the another error correction decoding is complex. On the other hand, in this embodiment, it is easy to control for this embodiment because the data transferred from each channel to the data buffer 102 does not include error, as shown in FIG. 6.

Figure 7:
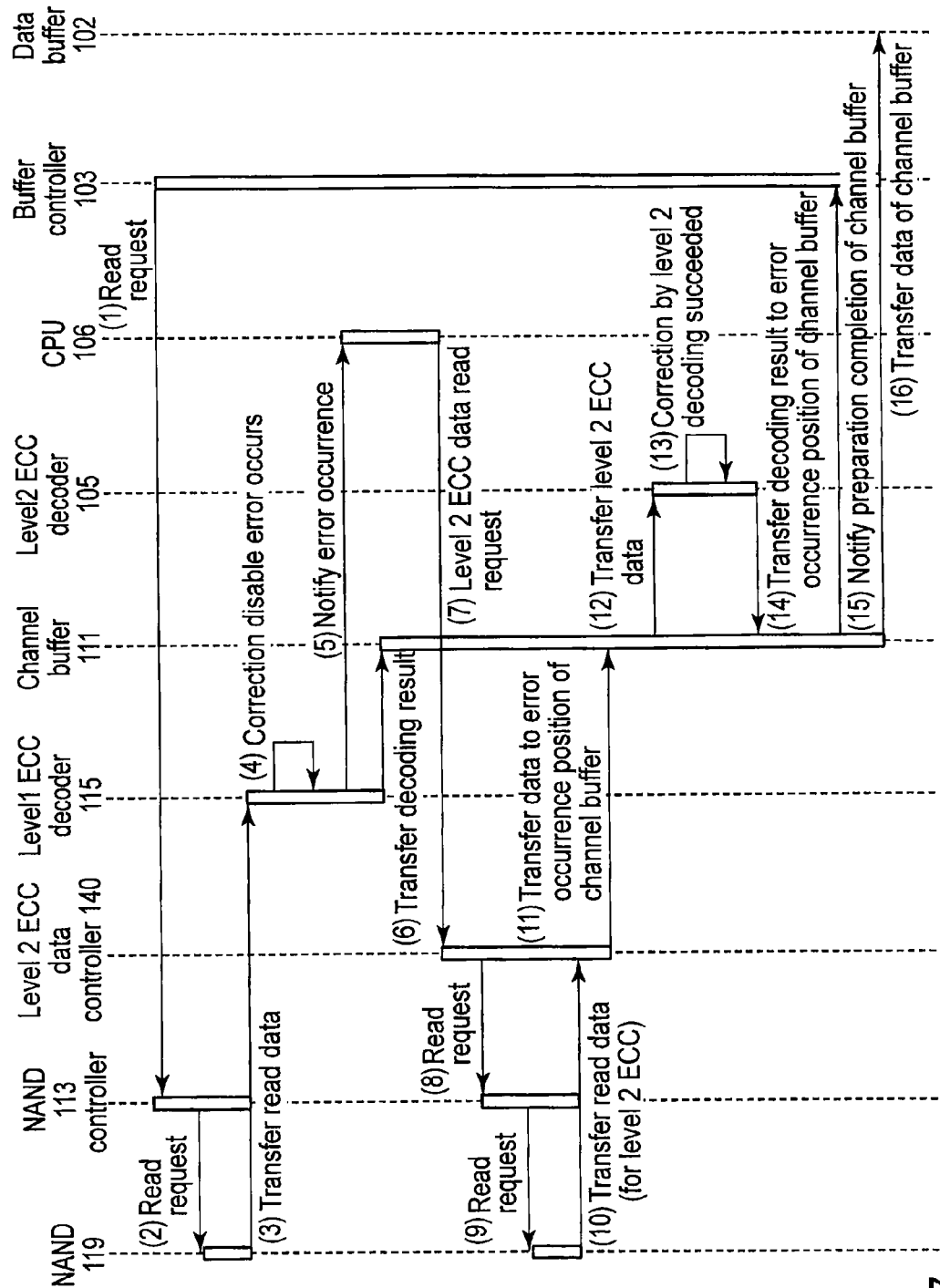
FIG. 7 is an exemplary sequence chart showing the processing procedure of the error correction decoding of the controller according to the first embodiment.

A level 2 ECC error correcting operation according to this embodiment will be described next with reference to the sequence chart of FIG. 7. Note that the operation of one channel (CH0) out of the four channels will be explained for the descriptive convenience.

The operation will be described in the order of numbers shown in FIG. 7. (1) The NAND controller 113 receives a read request from the host 116 via the buffer controller 103. (2) The NAND controller 113 issues a read command to the NAND 119a. (3) The NAND controller 113 transfers data read from the NAND 119a to the level 1 ECC decoder 115. (4) The level 1 ECC decoder 115 performs decoding using the level 1 ECCs for the data transferred from the NAND controller 113. An error occurs as a result of decoding. (5) The level 1 ECC decoder 115 notifies the CPU 106 that the error has occurred by the level 1 ECC decoding.

(6) The level 1 ECC decoder 115 stores, in the channel buffer 111, both a result (data) including the level 1 ECC decoding error and a result (data) without the level 1 ECC decoding error. If the level 1 ECC decoding result does not include the error in all data, the channel buffer controller 112 transfers contents (decoding result) of the channel buffer 111 to the buffer controller 103. In this embodiment, however, since part of the level 1 ECC decoding result (data) includes the error, the data including the error is corrected by the level 2 ECC decoder 105. A result (data) without the error is transferred to the data buffer 102 together. For this reason, in (6) of FIG. 7, the buffer controller 103 does not notify the CPU 106 and the like that data could be read from the NAND 119a.

(7) The CPU 106 requests the level 2 ECC data read controller 140 to read the level 2 ECC data from the NAND 119a. Note that the level 2 ECC data is read in all channels (four channels). For this reason, the CPU 106 issues a read request to the level 2 ECC data controller of all channels.

(8) The level 2 ECC data controller 140 issues a read request to the NAND controller 113. (9) The NAND controller 113 issues a read command to the NAND 119a. (10) The NAND 119a transfers read data (level 2 ECC data) to the level 1 ECC decoder 115. (11) The data read from the NAND 119a is transferred to the area of the channel buffer 111 including the level 1 ECC uncorrectable error in the data sent to the channel buffer 111 in the processing of (6).

(12) The channel buffer 111 transfers, to the level 2 ECC decoder 105, the level 2 ECC data read from the NAND 119a to the channel buffer 111. Note that if the data needs to be transferred to the level 2 ECC decoder 105 in a data unit which can read via the area 31, the processes of (8) to (12) are performed four times to further read the level 2 ECC data. More specifically, the channel buffer 111 transfers, to the level 2 ECC decoder 105, the data of Cluster 0 Sector 0 that is the level 2 ECC data read from the NAND 119a to the channel buffer 111 in (12). After that, in the above-described processing of (8), the level 2 ECC data controller 140 issues a read request to the NAND controller 113 to read the data of Cluster 4 Sector 0 that is the level 2 ECC data. After the above-described processes of (9), (10), and (11) have been executed, the data of Cluster 4 Sector 0 is transferred to the level 2 ECC decoder 105. The same processes as those of (8) to (12) performed for Cluster 0 Sector 0 and Cluster 4 Sector 0 are executed for Cluster 5 Sector 0 and Cluster 6 Sector 0 as well.

In the processing of (12), the level 2 ECC data exists in all channels. For this reason, the level 2 ECC data read from the NANDs 119 in all channels are transferred to the level 2 ECC decoder 105.

(13) As the result of the level 2 ECC decoding by the level 2 ECC decoder 105, the error in the data, which could not be corrected by the level 1 ECC decoding, is successfully corrected. The data that could not be corrected by the level 1 ECC decoding in the processing of (4) is thus restored. (14) The level 2 ECC decoder 105 transfers the reconstructed data to the error occurrence area (position) of the channel buffer 111. (15) The channel buffer 111 notifies the buffer controller 103 that the data read from the NAND 119 is prepared on the channel buffer 111. (16) The buffer controller 103 transfers the data of the channel buffer 111 to the data buffer 102. The data (read data) transferred to the data buffer 102 is sent (returned) to the host 116 via the host interface 117.

The flow of data between the controller 10 and the NAND 119 will be described next with reference to FIG. 8. Note that in FIG. 8, the NAND 119 represents one of the NANDs 119a to 119d.

First, data is written to the NAND 119. (1) The controller 10 issues a write request to the NAND 119 to write data. The data (write data) to be written to the NAND 119 is data that has undergone the level 1 ECC encoding or the level 2 ECC encoding by the controller 10. (2) The write data is transferred from the controller 10 to the NAND 119 and written to the NAND 119. Note that the write data may be transferred to the NAND 119 for each channel on the cluster basis as shown in FIG. 2. For example, data corresponding to Cluster 0 is transferred to the NAND 119a and written by CH0.

Note that the processes of (1) and (2) are performed in advance when reading data from the NAND 119. Hence, the processes of (1) and (2) in FIG. 8 need not always be performed before execution of processes of (3) to (12) in FIG. 8 to be described next. That is, it is necessary only that data is stored in the NAND 119 that is encoded to be able to decode of this embodiment as shown in FIG. 7.

Next, data is read from the NAND 119. (3) The controller 10 issues a read request of the data (data corresponding to Cluster 0 to Cluster 3) written to the NAND 119. (4) In response to the read request, data corresponding to Cluster 0 to Cluster 3 are transferred from the NAND 119 to the controller 10 by each of CH0, CH1, CH2, and CH3. More specifically, data corresponding to Cluster 0 read from the NAND 119a is transferred to the controller 10 by CH0. Data corresponding to Cluster 1 read from the NAND 119b is transferred to the controller 10 by CH1. Data corresponding to Cluster 2 read from the NAND 119c is transferred to the controller 10 by CH2. Data corresponding to Cluster 3 read from the NAND 119d is transferred to the controller 10 by CH3.

After the processing of (4) in FIG. 8, if the read data includes the error, (5) the controller 10 issues a level 2 ECC data transfer request to the NAND 119. (6) In response to the level 2 ECC data transfer request, the level 2 ECC data read from the NAND 119 is transferred to the controller 10 and finally transferred to the level 2 ECC decoder 105 via the error occurrence area (area 31) of the channel buffer 111. In the processes of (7) and (8) of FIG. 8, the same process as in each of the processes of (5) and (6) of FIG. 8 are performed. More specifically, if the error exists in Cluster 0 Sector 0 shown in FIG. 2, the processes of (7) and (8) in FIG. 8 are performed four times to read the level 2 ECC data. In the first processing, data corresponding to Cluster 4 Sector 0 read from the NAND 119a by CH0 is transferred to the controller 10, and finally transferred to the level 2 ECC decoder 105 via the area 31. In the second processing, data corresponding to Cluster 5 Sector 0 read from the NAND 119b by CH1 is transferred to the controller 10, and finally transferred to the level 2 ECC decoder 105 via the area 31. In the third processing, data corresponding to Cluster 6 Sector 0 read from the NAND 119c by CH2 is transferred to the controller 10, and finally transferred to the level 2 ECC decoder 105 via the area 31. In the fourth processing, data corresponding to the Level 2 ECC Sector 0 read from the NAND 119d by CH3 is transferred to the controller 10, and finally transferred to the level 2 ECC decoder 105 via the area 31.

By the processes of (7) and (8) in FIG. 8, the level 2 ECC data is read from the NAND 119. The error in the data corresponding to Cluster 0 to Cluster 3 read from the NANDs 119a to 119d is corrected by the level 2 ECC decoding. The error is eliminated from the error correction result in the channel buffer 11 of each channel. As the result of error correction, the data corresponding to Cluster 0 to Cluster 3 stored in each of the channel buffers of the channels are transferred from the channel buffer to the data buffer 102 of each channel to the data buffer 102. After that, processes of (9) to (12) in FIG. 8 are performed.

In (9) to (12) in FIG. 8, data corresponding to each of Cluster 4 to Cluster 6 are read. Note that a description of the same processes as the above-described processes of (3) to (8) of FIG. 8 will be omitted. In the processes of (9) and (10), data corresponding to Cluster 4 to Cluster 6 are read from the NANDs 119a to 119c by CH0 to CH2. Note that data corresponding to the Level 2 ECC Sector 0 to the Level 2 ECC Sector 7 are data to be used to perform the level 2 ECC decoding, and may be read by CH3, although the data corresponding to the Level 2 ECC Sector 0 to the Level 2 ECC Sector 7 need not always be read. If the level 1 ECC decoding is performed for the read data corresponding to Cluster 4 to Cluster 6, and the error correction results included in the data corresponding to Cluster 4 to Cluster 6 does not include the error, the processes of (11) and (12) in FIG. 8 may not be performed.

An example of the storage position of data stored in the channel buffer 111 will be described next with reference to FIG. 9.

As shown in FIG. 2, in case that the level 2 ECC is generated, a data sector number including the error upon the level 1 ECC decoding matches a data sector number corresponding to the level 2 ECC data. Hence, the level 1 ECC decoding results is stored in the channel buffer 111 by the level 2 ECC data controller 140 as shown in FIG. 9. With this arrangement, the level 2 ECC data can easily be read from the NAND 119 and the read level 2 ECC data can be transferred to the area (position) where the error has occurred upon the level 1 ECC decoding.

Figure 9:
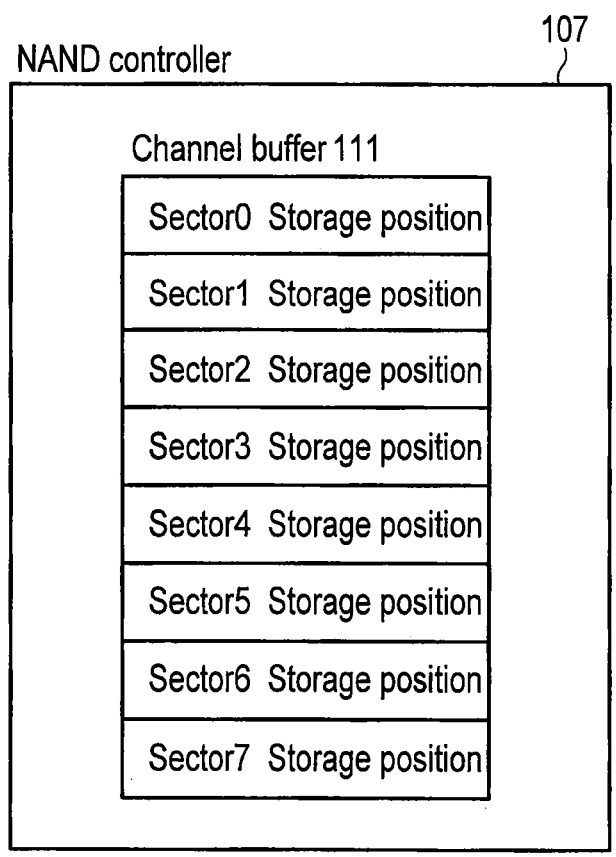
FIG. 9 is an exemplary view showing an example of a data storage position in a channel buffer according to the first embodiment.

For example, as shown in FIG. 9, the area in the channel buffer 111 is divided into eight areas corresponding to each of Sector 0 to Sector 7. Decoding results (data) corresponding to Sector 0, Sector 1, Sector 2, Sector 3, Sector 4, Sector 5, Sector 6, and Sector 7 are stored in the eight areas (storage positions) sequentially from the upper side of the channel buffer 111. In each of the four channels as well, decoding results (data) corresponding to Sector 0, Sector 1, Sector 2, Sector 3, Sector 4, Sector 5, Sector 6, and Sector 7 are stored in the eight areas (storage positions) of the channel buffer sequentially from the upper side of the channel buffer 111.

For example, if the error exists at the Sector 0 storage position, the level 2 ECC data controller 140 can read the level 2 ECC data corresponding to Sector 0 using the Sector 0 storage position in each channel.

As another example, in case that the level 1 ECC decoding error has occurred, position information is stored by the level 2 ECC data controller 140, representing the position where the decoding result including the error is stored, to specify the error occurrence area (position) on the channel buffer 111. The level 2 ECC data controller 140 can read the level 2 ECC data based on the position information.

As described above, according to the first embodiment, it is possible to reduce the storage area to store data necessary for error correction decoding. For example, the circuit scale of the storage area in the nonvolatile memory controller can be made smaller. More specifically, data necessary for performing second error correction decoding is transferred from the nonvolatile memory to the second error correction decoder using an area where a result of first error correction decoding is stored, thereby sharing the storage area. Hence, it is unnecessary to newly provide a buffer to store the data necessary for performing the second error correction decoding. In case of reading data from the nonvolatile memory via a plurality of channels, a decoding result (data) by the second error correction decoder is written to an area where a first error correction decoding result including the error is stored. This allows to read (normal) data without the error from each channel regardless of whether the error has occurred in the first error correction decoding, thus facilitating control. An area of a predetermined channel where a first error correction decoding result without the error is stored is not used to perform the second error correction decoding for a result including the error in the same channel as the predetermined channel. For this reason, there exists no risk that the first error correction decoding result without the error is destroyed, for example, erased. The buffer to store data necessary to perform the second error correction decoding need be provided neither in nor outside the nonvolatile memory controller.

Second Embodiment

The second embodiment will be described below with reference to the accompanying drawings.

Note that a description of the same configurations and functions as in the first embodiment will be omitted.

In the first embodiment, the level 2 ECC decoding is performed using a plurality of channels. However, in the second embodiment, it is assumed that the level 2 ECC decoding is performed using a single channel.

A level 2 ECC (to be referred to as a second level 2 ECC hereinafter) used in the second embodiment is generated based on not data across a plurality of channels, unlike the level 2 ECC used in the first embodiment, but data to be able to access (read) in the single channel. For example, the second level 2 ECC is generated based on the Cluster 0 Sector 0 and the Cluster 0 Sector 1 assigned to the single channel (CH0) in FIG. 2. The generated second level 2 ECC is used to read and decode data included in the Cluster 0 Sector 0 and the Cluster 0 Sector 1 in the CH0.

This will be described in detail with reference to FIG. 10. FIG. 10 is a block diagram showing a system configuration according to the second embodiment. A NAND controller 107 includes the channel buffer 111, the channel buffer controller 112, the NAND controller 113, the level 1 ECC encoder 114, the level 1 ECC decoder 115, the level 2 ECC data read controller 140, a level 2 ECC encoder 150, and a level 2 ECC decoder 151.

The level 2 ECC encoder 150 is an encoder for second level 2 ECC encoding. The level 2 ECC decoder 151 is a decoder for second level 2 ECC decoding.

In case that the level 1 ECC decoding result includes the error, the level 2 ECC data controller 140 transfers the second level 2 ECC data from the NAND 119 to the level 2 ECC decoder 151 in the NAND controller 107 using the area (error area) of the channel buffer 111 where the level 1 ECC decoding result including the error is stored. The level 2 ECC decoder 151 writes back a decoding result without the error to the error area. Next, the buffer controller 103 sends the data without the error in the channel buffer 111 to the data buffer 102. A host interface controller 101 sends the data stored in the data buffer 102 to the host 116.

As described above, according to the second embodiment, the same effects as in the first embodiment can be obtained even without using data across a plurality of channels, for example, even if the second error correcting code (level 2 ECC) is generated without using data across a plurality of channels.

Third Embodiment

The third embodiment will be described below with reference to the accompanying drawings.

Note that a description of the same configurations and functions as in the first and second embodiments will be omitted.

In the third embodiment, it is assumed that the controller 10, and the four NANDs 119a to 119d or one NAND 119a, according to the first embodiment or second embodiment are implemented in the electronic apparatus 1 or the like.

Figure 11:
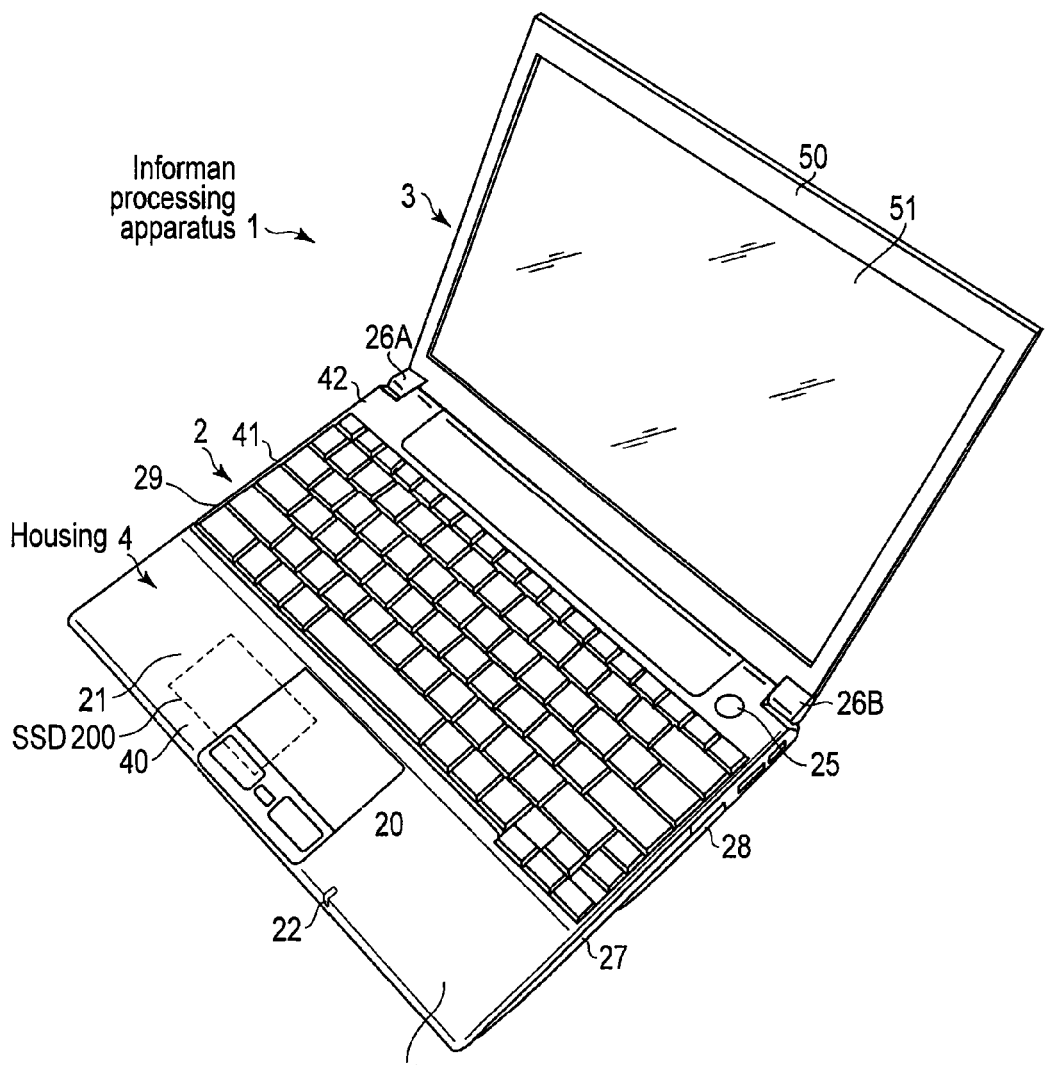
FIG. 11 is an exemplary perspective view showing the outer appearance of an electronic device according to the third embodiment.

FIG. 11 is a schematic view showing the outer appearance of the electronic apparatus 1 according to this embodiment. The electronic apparatus 1 includes a main body 2 and a display unit 3 attached to the main body 2.

The main body 2 includes a box-shaped housing 4. The housing 4 includes a front portion 40, a central portion 41, and a back portion 42 sequentially from the side close to the user who operates the electronic device 1. The front portion 40 includes a touch pad 20 which is a pointing device, a palm rest 21, and an LED 22 that lights up in synchronism with the operation of each portion of the electronic apparatus 1. The central portion 41 includes a keyboard to be able to input character information and the like. The back portion 42 includes a power switch 25 that powers on the electronic apparatus 1, and a pair of hinge portions 26A and 26B that rotatably support the display unit 3.

An outlet 29 is incorporated in the left side wall of the housing 4. An ODD (Optical Disk Drive) 27 to be able to write/read data to/from an optical storage medium such as a DVD and a card slot 28 that receives or ejects various kinds of cards are arranged in the right side wall of the housing 4.

The housing 4 is formed from a housing cover including part of the peripheral wall and the upper wall, and a housing base including part of the peripheral wall and the lower wall. The housing cover is detachably combined with the housing base and forms a storage space with respect to the housing base. The storage space stores, for example, an SSD (Solid State Drive) 200 that is a multilevel semiconductor storage apparatus or a nonvolatile semiconductor storage apparatus.

The display unit 3 includes a display portion 50 formed from an LCD or the like which can display an image or the like on a display screen 51.

Figure 12:
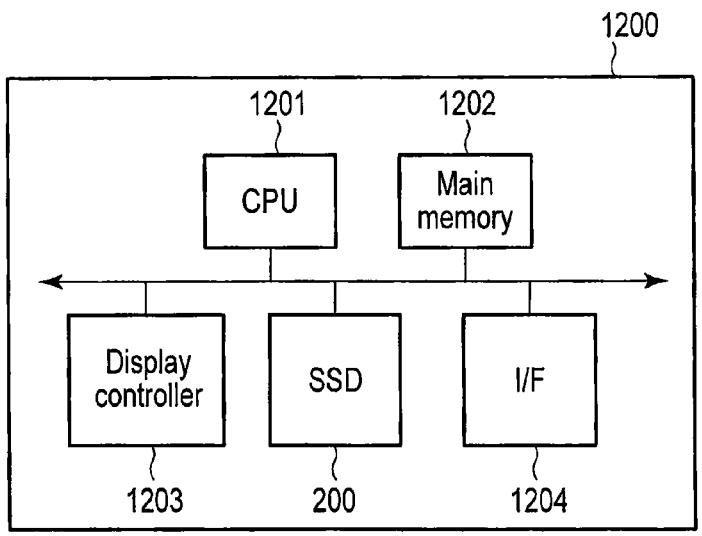
FIG. 12 is an exemplary block diagram showing the system configuration of the electronic device according to the third embodiment.

FIG. 12 is a block diagram showing the system configuration of the electronic apparatus 1.

As shown in FIG. 12, the electronic apparatus 1 includes the SSD 200, a CPU (Central Processing Unit) 1201, a main memory 1202, and a display controller 1203. The SSD 200, the CPU 1201, the main memory 1202, the display controller 1203, and the like are connected via a bus or the like, as shown in FIG. 12.

The CPU 1201 is a processor that controls the operations of the components in the electronic apparatus 1. The CPU 1201 executes various kinds of applications such as an OS (Operating System) based on data loaded from the SSD 200 to the main memory 1202. Note that in the first to third embodiments, the CPU 1201 corresponds to the host 116. The CPU 1201 also executes BIOS stored in a BIOS-ROM (not shown). The BIOS is a program for hardware control.

An I/F 1204 is used to, for example, receive an image data file stored in a digital camera. The I/F 1204 is used to write/read data to/from a memory card such as an SD card inserted into the card slot 28 incorporated in the electronic apparatus 1. For example, data read from a card memory is written to the SSD 200.

The display controller 1203 controls to display data read from the SSD 200 on the display screen. For example, the display controller 1203 displays, on the display screen 31, image data and program data such as the OS read from the SSD 200 to make the user recognize the image data or the like.

Figure 13:
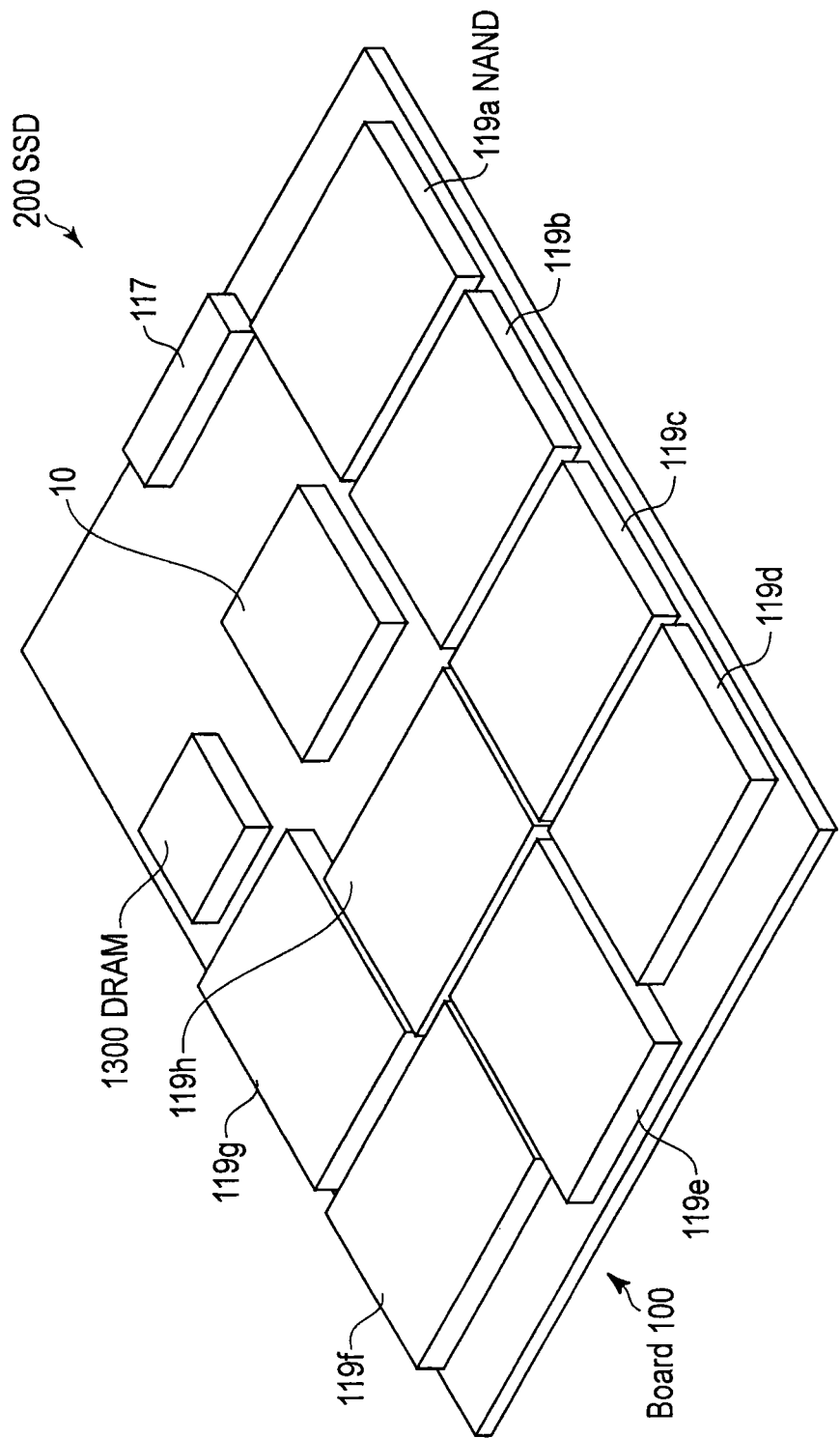
FIG. 13 is an exemplary view showing the outer appearance of an SSD incorporated in the electronic device according to the third embodiment.

FIG. 13 is a schematic view showing the outer appearance of the SSD 200. The SSD 200 includes a board 100. A host interface 117, the controller 10, the NANDs 119*a* to 119*h*, and a DRAM 1300 are mounted on the board 100. The NANDs 119*a* to 119*h* have the same shape. The SSD 200 is an external storage apparatus that stores data and programs and does not erase the records even without power supply. The SSD 200 is a drive formed from a nonvolatile semiconductor memory that can operate as the startup drive of the electronic apparatus 1 and readably/writably store programs such as the OS, data created by the user, or data created based on execution of software, in the storage areas of the eight NANDs 119*a* to 119*h* mounted on the board 100 for a long time. The nonvolatile semiconductor memory need only be the nonvolatile memory. It is not limited to a memory made of a semiconductor, and can be, for example, a disk-shaped recording medium.

The NANDs 119*a* to 119*h* have, for example, rectangular shape, as shown in FIG. 13, and are mounted to be adjacent on the board 100. The DRAM 1300 corresponds to the data buffer 102 described above in the first and second embodiments.

The host interface 117 is connected to the CPU 1201 that is the host 116 via a bus shown in FIG. 12 or the like.

In this embodiment, eight NANDs are mounted on the board 100. However, in case that the controller 10 according to the first embodiment is mounted on the board 100, four NANDs are mounted on the board 100. In case that the controller 10 according to the second embodiment is mounted on the board 100, one NAND is mounted on the board 100.

As described above, according to the third embodiment, the storage area to store data necessary for performing the error correction decoding can be reduced even in the electronic apparatus 1 in which the SSD 200 including the controller to control the nonvolatile memory described above in the first and second embodiments is mounted.

Note that the functions of the modules as shown in FIGS. 1 and 10 can be implemented by software (computer program). It is therefore possible to easily implement the same effect as in the first and third embodiments by installing the software in a normal computer via a computer-readable storage medium storing the software and executing it.

The functions of the modules shown in FIGS. 1 and 10 may be implemented by hardware such as a dedicated LSI or DSP.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage apparatus comprising:
a read module configured to read first sector data and a first error correcting code associated with the first sector data from a nonvolatile memory;
a first decoder configured to perform first decoding for the read first sector data using the read first error correcting code to correct an error in the read first sector data;
a first buffer configured to store an error correction result by the first decoding;
a second decoder configured to perform second decoding for decoding-data associated with a second error correcting code, using the second error correcting code to correct at an accuracy higher than an accuracy of the first error correcting code, if the error correction result stored in the first buffer comprises information indicating that the error cannot be corrected using the first error correcting code; and
a transfer controller configured to transfer the second error correcting code and the decoding-data to the second decoder via the first buffer storing the error correction result with the information, to perform the second decoding.

2. The apparatus of claim 1, wherein the transfer controller is further configured to transfer the first sector data restored by the second decoding from the second decoder to the first buffer as an error correction result by the second decoding, to write the error correction result by the second decoding to the first buffer.

3. The apparatus of claim 2, wherein
the nonvolatile memory is able to be accessed via a plurality of channels,
the plurality of channels comprise a first channel comprising the first buffer and a second channel comprising a second buffer, and
the transfer controller is further configured to transfer, to a host, the error correction result by the second decoding stored in the first buffer and the error correction result for second sector data by the first decoding, which is stored in the second buffer, if the error correction result for the second sector data by the first decoding does not comprise the information.

4. The apparatus of claim 2, wherein
the nonvolatile memory is able to access via a plurality of channels,
the plurality of channels comprise a first channel comprising the first buffer and a second channel comprising a second buffer,
each of the first buffer and the second buffer comprises a plurality of areas to store error correction results for different sector data, and
the transfer controller is further configured to transfer the error correction results for the different sector data to a host, wherein the error correction results for the different sector data do not comprise the information and are stored in the plurality of areas of each of the first buffer and the second buffer, after the second decoding by the second decoder is performed, if the error correction results for the different sector data do not comprise the information in any of the plurality of areas of each of the first buffer and the second buffer.

5. The apparatus of claim 4, wherein
the first error correcting code is used by the first decoder incorporated in each of the plurality of channels to perform the first decoding,
the second decoder is further configured to be incorporated in the storage apparatus to perform the second decoding while being shared by the plurality of channels, and
the second error correcting code is used by the shared second decoder to perform the second decoding.

6. The apparatus of claim 1, wherein
the read module is further configured to read second sector data and the second error correcting code associated with the second sector data from the nonvolatile memory,
the first decoder is further configured to perform the first decoding for the read second sector data using the read second error correcting code to correct the error in the read second sector data;
the first buffer is further configured to store the error correction result for the first sector data by the first decoding in a first area that is a partial area of the first buffer, and to store the error correction result for the second sector data by the first decoding in a second area that is another partial area of the first buffer; and
the transfer controller is further configured to control to transfer the second error correcting code and the decoding-data to the second decoder via the first area and to control to perform the second decoding without transferring the error correction result for the second sector data by the first decoding to another buffer, the error correction result for the second sector data being stored in the second area or without changing the error correction result for the second sector data by the first decoding, the error correction result for the second sector data being stored in the second area, if the error correction result for the first sector data by the first decoding comprises the information, and the error correction result for the second sector data by the first decoding does not comprises the information.

7. The apparatus of claim 6, wherein
if the read first sector data is restored by the second decoding, the transfer controller is further configured to control to transfer the restored first sector data to the first buffer as the error correction result by the second decoding and to control to write the error correction result by the second decoding to the first buffer, and
the transfer controller is further configured to control to transfer, to a host, the error correction result for the first sector data by the second decoding and the error correction result for the second sector data by the first decoding.

8. The apparatus of claim 6, wherein the transfer controller is further configured to transfer the error correction result for the second sector data by the first decoding, the error correction result for the second sector data being stored in the second area, to the second decoder as the decoding-data, if the second sector data is the decoding-data.

9. The apparatus of claim 6, wherein
the first sector data is stored in a predetermined data sector of the nonvolatile memory, and
the transfer controller is further configured to control to specify the first area based on information indicating that the first area corresponds to the predetermined data sector.

10. The apparatus of claim 6, wherein the transfer controller is further configured to control to specify the first area based on position information that area of the first buffer is the first area.

11. The apparatus of claim 1, further comprising third decoder configured to perform third decoding for decoding-data associated with a third error correcting code, using the third error correcting code allowing to correct at an accuracy higher than an accuracy of the second error correcting code, in case that the read first sector data without the error is not able to be restored even if the second decoder performs the second decoding.

12. The apparatus of claim 1, wherein if the error correction result stored in the first buffer comprises the information, the transfer controller is further configured to control to perform the second decoding without notifying a host that the information exists, and if the information does not exist, to transfer the restored first sector data stored in the first buffer to the host.

13. The apparatus of claim 1, wherein the decoding data comprises the first sector data.

14. A controller comprising:
a first decoder configured to perform first error correction decoding using a first error correcting code to correct an error in read data;
a first buffer configured to store a result of the first error correction decoding for first data stored in a nonvolatile memory;
a second decoder configured to perform second error correction decoding for decoding-data associated with a second error correcting code, using the second error correcting code to correct at an accuracy higher than an accuracy of the first error correcting code, if an error correction result includes information indicating that the error cannot be corrected using the first error correcting code; and
a transfer module configured to transfer, using a first area of the first buffer storing the result of the first error correction decoding, data necessary to perform the second error correction decoding for the first data to the nonvolatile memory.

15. A storage apparatus comprising:
a first decoder configured to perform, using a first error correcting code, first decoding for first data read from a nonvolatile memory to correct an error in the read first data; and
a second decoder to perform second error correction decoding for decoding-data associated with a second error correcting code, using the second error correcting code to correct at an accuracy higher than an accuracy of the first error correcting code, if an error correction result includes information indicating that the error cannot be corrected using the first error correcting code, using a second code different from the first code, second decoding for second data associated with the second code,
wherein the second data is sent from a buffer storing a result of the first decoding to the second decoder.

* * * * *